United States Patent [19]
Teel et al.

[11] Patent Number: 5,579,263
[45] Date of Patent: Nov. 26, 1996

[54] POST-FABRICATION SELECTABLE REGISTERED AND NON-REGISTERED MEMORY

[75] Inventors: Thomas A. Teel; David C. McClure, both of Dallas, Tex.

[73] Assignee: SGS-Thomson Microelectronics, Inc., Carrollton, Tex.

[21] Appl. No.: 362,187

[22] Filed: Dec. 22, 1994

[51] Int. Cl.$^6$ .............................. G06F 12/00; G06F 7/00
[52] U.S. Cl. ........................... 365/189.02; 365/189.01; 365/189.05; 365/220
[58] Field of Search .................. 365/189.02, 230.01, 365/189.01, 221, 230.02

[56] References Cited

U.S. PATENT DOCUMENTS

| | | | |
|---|---|---|---|
| 4,447,876 | 5/1984 | Moore | 364/200 |
| 4,903,240 | 2/1990 | Von Flue | 365/189.02 |
| 4,933,897 | 6/1990 | Shankar et al. | 364/900 |
| 5,311,509 | 5/1994 | Heddes et al. | 370/60 |
| 5,341,488 | 8/1994 | Kobayashi | 395/425 |

*Primary Examiner*—Viet Q. Nguyen
*Attorney, Agent, or Firm*—Theodore E. Galanthay; Robert Groover; Lisa K. Jorgenson

[57] ABSTRACT

A memory and a method involving the memory. The memory includes a memory array having a data quantity output for outputting a data quantity and a data output driver having an input for receiving the data quantity and an output for outputting the data quantity from the memory. The memory further includes a data quantity pipeline register having an input for receiving the data quantity and an output coupled to the input of the data output driver. Finally, the memory includes means for selectively coupling a data quantity from the data output of the memory array to the input of the data output driver in a first operational mode and to the input of the data quantity pipeline register in a second operational mode.

26 Claims, 3 Drawing Sheets

POST-FABRICATION SELECTABLE REGISTERED AND NON-REGISTERED MEMORY

This invention relates to digital memories, and is more particularly directed to a memory which may be converted between a non-registered memory and a registered memory after the memory is fabricated.

BACKGROUND OF THE INVENTION

In high speed clocked memories, the overall memory access speed is often enhanced by including a pipeline register between the memory array output and the output driver. These memories are referred to as "registered" memories. Registered memories contrast with standard or "non-registered" memories which output only a single data quantity at a time, typically from a memory array to a single stage output driver.

In some applications, registered memories have faster access times than non-registered memories because of the pipeline register. Specifically, the pipelining effect created by the pipeline register allows one data quantity to be output from the pipeline register while, during an overlapping time period, the next data quantity is being fetched into the memory pipeline. For example, when using a registered memory in a burst address mode, when the first quantity is being output from the pipeline register, the second quantity in the burst sequence is being fetched into the pipeline register. Thus, the time between output quantities is only limited by the delay of the pipeline register (i.e., the time from clocking the pipeline register to the time it outputs the data) plus the delay of the output driver. In contrast, a non-registered memory has no pipelining and, thus, overlapping operations cannot occur.

In current (and future) computer systems, high speed clocked memories are often used as secondary data cache memory. Both registered and non-registered clocked memories may be used depending on availability and cost. Typically, a memory is commercially available in both registered and nonregistered output versions with otherwise identical specifications (other than access speed). In the prior art, these registered and non-registered memories are fabricated such that the decision between rendering a part either registered or non-registered must be made during the fabrication of the device. Typically, one or more of the fabrication layers of the device are identical, with a change in the metal layer determining whether the memory is registered or non-registered when construction is complete.

The present invention recognizes significant problems with the prior art technique for fabricating a memory as either registered or non-registered. For example, it is known that semiconductor fabrication techniques often yield parts with diverse speeds due to process variations and the like. Thus, if a part is already fabricated as a non-registered memory, but does not provide satisfactory output speed from its memory array, it may be useless and therefore necessary to discard the part. Obviously, such a result is costly, particularly if numerous slow parts are produced. Further, under the prior art, once the speed of the memory can be tested, at that point, the memory is already registered or non-registered and cannot be changed.

It is therefore an object of the present invention to provide a method and apparatus involving a memory which may be converted between a non-registered memory and a registered memory after the memory is fabricated.

It is a further object of the present invention to provide such a method and apparatus where the conversion of the memory is accomplished by rendering a fuse included within the memory not intact in order to change the operational mode of the memory.

It is a further object of the present invention to provide a method and apparatus involving a memory operable in a burst mode.

It is a further object of the present invention to provide such a method and apparatus where costs of fabrication and manufacture are reduced and yields are improved.

Still other objects and advantages of the present invention will become apparent to those of ordinary skill in the art having references to the following specification together with its drawings.

SUMMARY OF THE INVENTION

In the preferred embodiment, the present invention includes a memory and a method involving the memory. The memory includes a memory array having a data quantity output for outputting a data quantity and a data output driver having an input for receiving the data quantity and an output for outputting the data quantity from the memory. The memory further includes a data quantity pipeline having an input for 10. receiving the data quantity and an output coupled to the input of the data output driver. Finally, the memory includes means for selectively coupling a data quantity from the data output of the memory array to said input of the data output driver in a first operational mode and to the input of the data quantity pipeline in a second operational mode.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

The preferred embodiment of the present invention and its advantages are best understood by referring to FIGS. 1–5 of the drawings, like numerals being used for like and corresponding parts of the various drawings.

Figure 1:
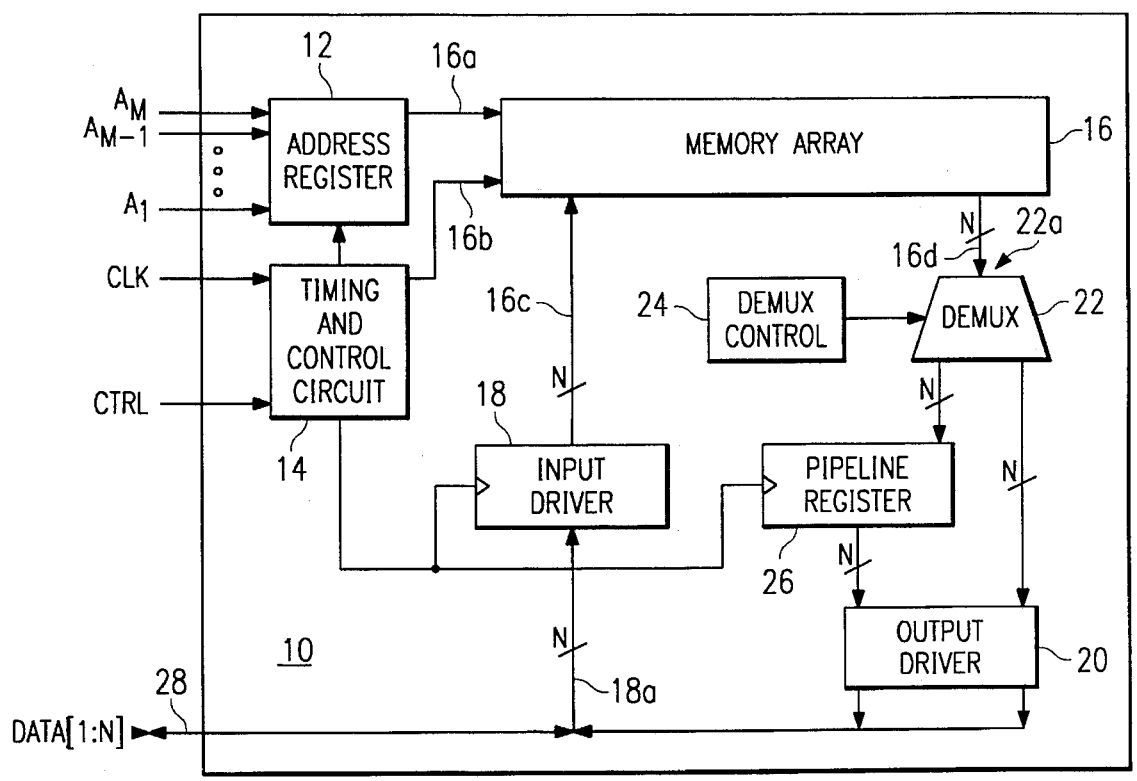
FIG. 1 illustrates a block diagram of a memory in accordance with the present invention.

FIG. 1 illustrates a block diagram of a memory 10 constructed according to the preferred embodiment of the present invention. Memory 10 includes an address register 12, a timing and control circuit 14, a memory array 16, an input driver 18, an output driver 20, a demultiplexer 22, a demultiplexer control circuit 24, and a pipeline register 26. The connections of these components as well as their corresponding functionality are described below. Before that discussion, note in general that memory 10 operates to receive an M bit address and, synchronous to a system clock (denoted "CLK"), to output an N bit data quantity. Note that M and N are integers and may be chosen by a person skilled in the art. Further, in addition to an N bit output, the circuit is easily modified so that the logic complement of each of the N bits is also output by memory 10.

Address register 12 includes an integer M number of address inputs labeled $A_1$ through $A_M$. As known in the memory art, the address inputs allow an M bit address to be applied to memory 10 and stored in address register 12. The address is clocked into address register 12 via CLK, where CLK is passed to address register 12 from timing and control circuit 14. Once the address is stored, address register 12 couples the address to memory array 16. In the preferred embodiment, memory 10 operates to output a single data quantity or, in a known burst mode, a burst of data quantities are successively output. Thus, timing and control circuit 14 also may alter the address in register 12, such as by incrementing the least significant bits, so that a burst of addresses is coupled to memory array 16. Timing and control circuit 14 is also illustrated as having a control input (denoted "CTRL") which is intended to represent various control and/or timing signals known in the art, such as read/write enable, output enable, burst mode enable, chip enable, and the like.

Memory array 16 is a standard memory storage area, and is sized and constructed according to the amount of storage needed. In general, array 16 receives an address at an input 16a, and data is either written to array 16 via input 16c or read from array 16 via output 16d. The input and output functions are detailed below.

Input to array 16 is performed as known in the art. Thus, a data quantity is applied to a data input/output pin 28 of memory 10. This data quantity is coupled to input 18a of input driver 18. Input driver 18 is then clocked by timing and control circuit 14, thereby outputting the data quantity to array 16. Array 16, with associated decode logic (not shown) then stores the data quantity at the address indicated at input 16a.

Output from array 16 operates as a key aspect of the present invention. Specifically, in the preferred embodiment, depending on how memory 10 is configured as described below, output may be either in a non-registered or registered operational mode. For either operational mode, array 16 outputs a data quantity at output 16d which is coupled to a data input 22a of demultiplexer 22. Demultiplexer 22, however, selectively directs the data quantity so that memory 10 operates as either a registered or non-registered memory depending on the control signal from demultiplexer control circuit 24. Particularly, in the registered memory operational mode, demultiplexer 22 couples the data quantity to pipeline register 26, and pipeline register 26 is clocked to eventually output the data to output driver 20. In the non-registered operational mode, demultiplexer 22 couples the data quantity directly to output driver 20, thereby bypassing pipeline register 26. Thus, one skilled in the art will readily appreciate that memory 10 may operate either as registered or non-registered based on the control from demultiplexer control circuit 24.

Figure 2:
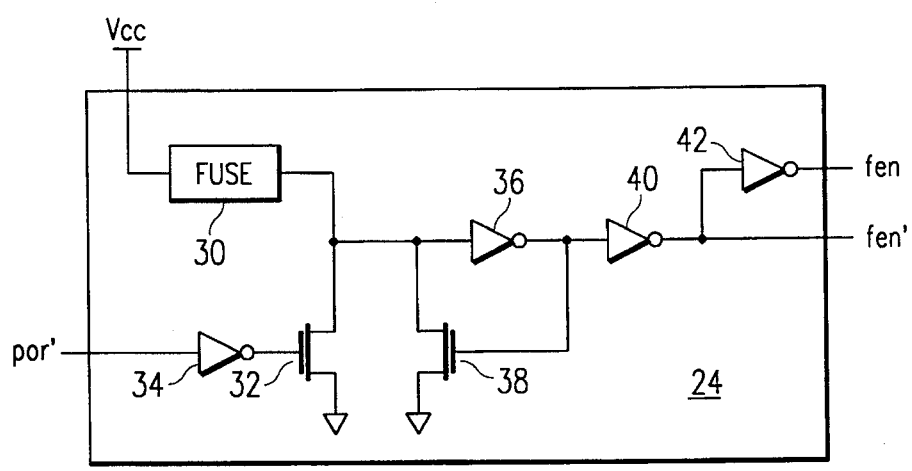
FIG. 2 illustrates a schematic of the preferred demultiplexer control circuit of the present invention.

FIG. 2 illustrates a schematic of the preferred circuitry for demultiplexer control circuit 24. Before proceeding with the detailed components, note that the circuitry of FIG. 2 preferably includes a fuse 30 which controls the state of the output signal (i.e., either a logic high or a logic low) depending on whether the fuse is intact (i.e., conducting) or whether the fuse is not intact (i.e., not conducting). As described above, the state of the output control signal from demultiplexer control 24 determines the operational mode of memory 10, that is, whether memory 10 operates as non-registered or registered. Thus, by either leaving fuse 30 intact, or by selectively rendering fuse 30 not intact, one may configure the memory of the present invention to operate as non-registered or registered.

Before proceeding with the various elements of FIG. 2, note in the preferred embodiment that fuse 30 is a polysilicon type of fuse, and is constructed using known polysilicon fabrication techniques. Thus, when it is desirable to render the fuse not intact (i.e., to change the operational mode of memory 10), the fuse is destroyed using known principles. For example, the fuse may be rendered not intact by subjecting it to a laser which emits a sufficiently high temperature energy beam, thereby severing the connection provided by the fuse. In addition, while the preferred fuse is a polysilicon fuse, note that a person skilled in the art could implement alternative fuses. For example, metal fuses or anti-fuses could be used as alternatives. As yet another example, instead of a fuse, an alternative type of connection may be formed using known "down bonding" techniques in order to select the operational mode of the memory. Briefly, and as is known in the art, after a semiconductor die is fabricated, the die is packaged using various techniques. Typically, the die includes bond pads which are connected, via bond wires, beam leads, or the like, to corresponding leads of an integrated circuit package. The cavity of the integrated circuit package is often connected to receive either $V_{cc}$ or ground; thus, instead of a fuse, an option may be included to connect a particular bond wire or other connection to the cavity voltage level; in other words, if the optional connection is made, the memory die will operate in a first operational mode (e.g., non-registered) or, alternatively, the bonding connection may be omitted to cause the memory die to operate in a second operational mode (e.g., registered).

Turning now to the specific components of FIG. 2, fuse 30 is connected on a first end to the power supply, denoted $V_{cc}$. The second end of fuse 30 is coupled to the drain of an n-channel transistor 32. The source of transistor 32 is connected to ground, and the gate of transistor 32 is connected to the output of an inverter 34. The input of inverter 34 receives a signal denoted por' meaning the complement of the power-on-reset (i.e., pot) signal. As known in the art, a power-on-reset signal toggles active for a short period of time when a system is started, typically to reset circuitry to a known operating state. The second end of fuse 30 is also connected to the input of an inverter 36, as well as to the drain of an n-channel transistor 38. The source of transistor 38 is connected to ground. The output of inverter 36 is connected to the gate of transistor 38, as well as to the input of an inverter 40. The output of inverter 40 provides a control signal fen', and is also connected to the input of an inverter 42. The output of inverter 42 provides a fuse enable (i.e., fuse intact) signal, denoted "fen", which is the logical complement of fen'signal output by inverter 40.

The operation of the components of FIG. 2 is as follows. In general, when fuse 30 is intact, fen is low and, therefore, fen' is high. Conversely, when fuse 30 is not intact, fen is high and, therefore, fen' is low. The detailed generation of these signals is as follows. Assuming that the system is already running, that is, por' has returned to a logical high, first consider the case where fuse 30 is intact. Fuse 30, therefore, couples a logical high (i.e., $V_{cc}$) to inverter 36. Inverter 36 outputs a logical low which: (1) has no effect as coupled to the gate of transistor 38; and (2) causes a high to be output by inverter 40. The high output from inverter 40 is then inverted by inverter 42 and, thus, fen is low when fuse 30 is intact (and, of course, fen' is high during this instance).

Next consider the case where fuse 30 is disabled. At start-up of operation, por' will toggle from a logical high, to a logical low for a small period of time, and then return to a logical high. During its brief period as a logical low, por' causes inverter 34 to output a logical high. This logical high turns on transistor 32, thereby pulling the input of inverter 36 to a logical low. Thus, inverter 36 outputs a logical high, which: (1) turns on transistor 38 thereby maintaining a logical low at the input of inverter 36; and (2) causes inverter 40 to output a logical low. Note further that once por' returns to a logical high, the output of inverter 36 will remain a logical high; in other words, although pot' going high may cause transistor 32 to not conduct, inverter 36 and transistor 38 have already been set in the state described immediately above. The logical low output by inverter 40 is again inverted by inverter 42 and, therefore, fen is high when the fuse is disabled (and, of course, fen' is low during this instance).

Given the above, one skilled in the art will readily appreciate that demultiplexer control circuit 24 outputs a control signal which has a different logical state depending on whether or not fuse 30 is intact. In the preferred embodiment, this concept is combined with FIG. 1 so that when fuse 30 is intact (i.e., fen low), memory 10 operates as a non-registered memory, that is, output data bypasses pipeline register 26 and goes directly from array 16 to output driver 20. Thus, in the preferred embodiment, when memory 10 is fabricated, fuse 30 is included within the fabrication process so that the default operation of memory 10 is as a non-registered memory.

Figure 3:
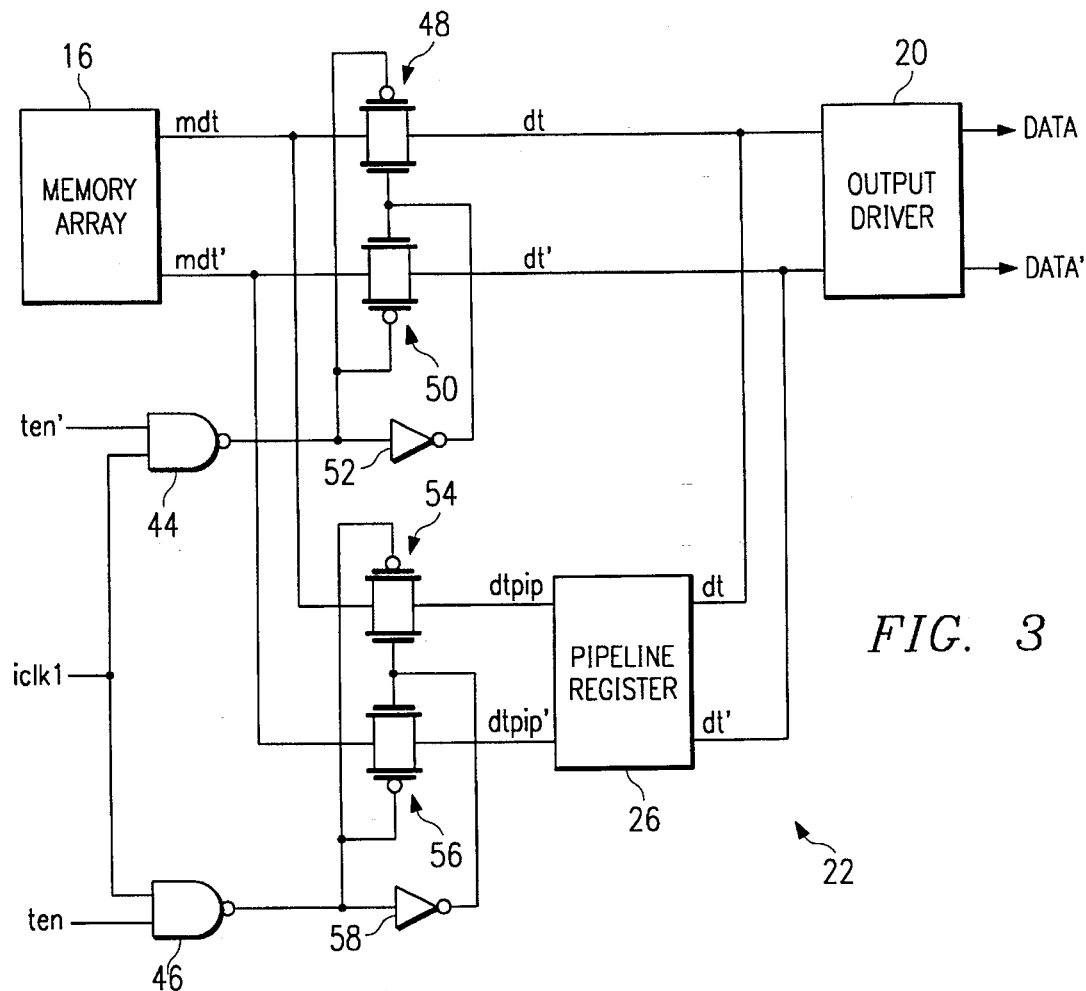
FIG. 3 illustrates a schematic of the preferred multiplexer circuit of the present invention.

FIG. 3 illustrates a schematic of demultiplexer 22 as coupled between memory array 16 and output driver 20. For purpose of illustrating the preferred embodiment, note that memory array 16 outputs a data quantity from memory, denoted "mdt", as well as the logical complement of that data quantity, the complement being denoted mdt'. Note that mdt and mdt' initially may be the same state due to precharging, but one or the other is then changed so that the signals are logically complementary. Demultiplexer 22 is controlled by the control signals fen and fen' which are created by the circuit of FIG. 2. Control signal fen' is connected to one input of a NAND gate 44 while its complement, fen, is connected to one input of a NAND gate 46. The second input of NAND gates 44 and 46 are connected to receive a first internal clock signal, denoted iclkl.

The output of NAND gate 44 is connected to the inverting control input of passgates 48 and 50, as well as to the input of an inverter 52. The output of inverter 52 is connected to the non-inverting control input of passgates 48 and 50. The data input of passgate 48 is connected to receive mdt, while the data input of passgate 50 is connected to receive mdt'. The data output of passgate 48 connects a data quantity, denoted dt, to output driver 20, while the output of passgate 50 connects the complement of that data quantity, the complement denoted as dt', to output driver 20

The output of NAND gate 46 is connected in a manner similar to the output of NAND gate 44. Specifically, the output of NAND gate 46 is connected to the inverting control input of passgates 54 and 56, as well as to the input of an inverter 58. The output of inverter 58 is connected to the non-inverting control input of passgates 54 and 56. The data input of passgate 54 is connected to receive mdt, while the data input of passgate 56 is connected to receive mdt'. The data output of passgate 54 connects a data quantity, denoted dtpip, to pipeline register 26, while the output of passgate 56 connects the complement of that data quantity, the complement denoted as dtpip', to pipeline register 26. The outputs of pipeline register 26, dt and dt', are coupled to the corresponding output nodes of passgates 48 and 50, respectively, and, therefore, are connected to the input of output driver 20.

The operation of the circuitry of FIG. 3 follows. Before discussing specific gating signals, recall generally that fen is logically low when fuse 30 (see FIG. 2) is intact, and this causes memory 10 to operate as a non-registered memory. In this instance, and referring to FIG. 3, data output from memory array 16 passes through passgates 48 and 50 directly to output driver 20, without entering pipeline register 26. Note also during this operational mode that the output of pipeline register 26 is tristated so as not to interfere with the outputs from passgates 48 and 50. Although not shown as a connection, this tristating is preferably performed by a control signal from timing and control circuit 14 shown in FIG. 1. Conversely, recall generally that fen is logically high when fuse 30 is disabled, and this causes memory 10 to operate as a registered memory. Thus, in FIG. 3, data output from memory array 16 first passes through passgates 54 and 56 to pipeline register 26, and only then is connected to output driver 20. The specific non-registered and registered operation of the gating of data through FIG. 3 is described immediately below.

In the non-registered operational mode, fen' is high (because fen is low). Once iclkl cycles high, the output of NAND gate 44 is low. The low output of NAND gate 44, when combined with the high output of inverter 52, causes passgates 48 and 50 to allow data to pass through those gates. Thus, mdt and mdt' pass through passgates 48 and 50, thereby coupling data (denoted dt and dt', respectively) to output driver 20. Output driver 20, therefore, outputs data corresponding to these signals, as denoted by DATA and its complement, DATA'. Also during the non-registered instance, because fen is low, the output of NAND gate 46 is high. This high is coupled to the inverting control inputs of passgates 54 and 56 which, therefore, do not allow data to pass through those gates. Thus, no data reaches pipeline register 26 during non-registered operation.

The registered operational mode is logically complementary of the non-registered operational mode. Thus, in the instance of registered operation, fen is high. Once iclkl cycles high, the output of NAND gate 46 is low. The low output of NAND gate 46, when combined with the high output of inverter 58, causes passgates 54 and 56 to allow data to pass through those gates. Thus, mdt and mdt' pass through passgates 54 and 56, thereby coupling corresponding data (after passing through the passgates) dtpip and dtpip', respectively, to pipeline register 26. The data quantities dtpip and dtpip' pass through various stages of pipeline register 26 and, once output, are coupled to corresponding inputs of output driver 20; thus, the outputs from pipeline register 26 are denoted dt and dt'. Thereafter, output driver 20, in turn, outputs DATA and DATA' corresponding to dt and dt', respectively. In view of the above, therefore, data passes through pipeline register 26 during registered operation.

Figure 4:
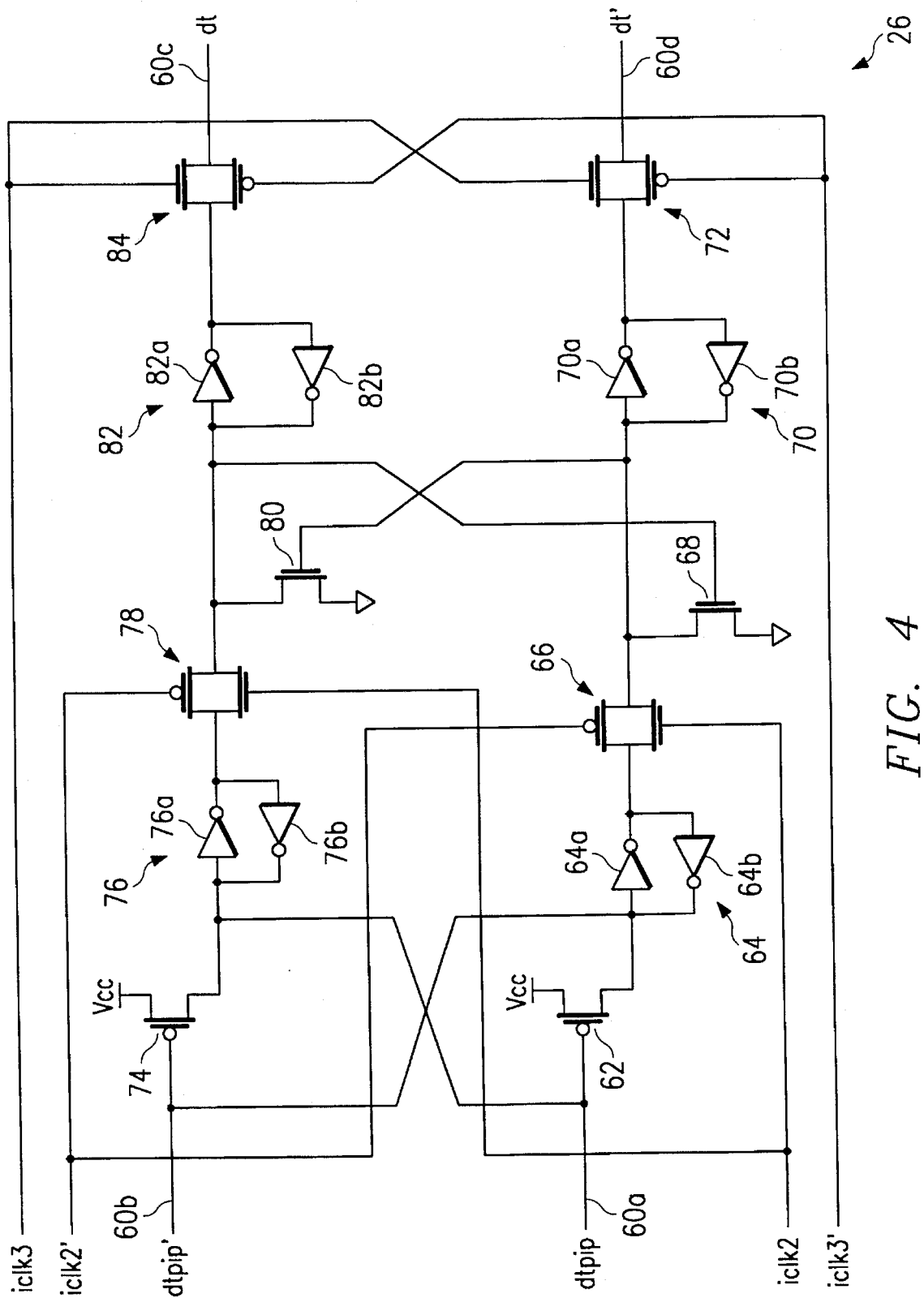
FIG. 4 illustrates a schematic of the preferred pipeline register of the present invention.

FIG. 4 illustrates a schematic of the preferred components of pipeline register 26 as connected in FIG. 3. Generally, pipeline register 26 receives the data quantities dtpip and dtpip' and, after clocking those data quantities through two storage latches, outputs corresponding data quantities dt and dt'. Particularly, pipeline register 26 includes data inputs 60a and 60b for receiving dtpip and dtpip', respectively, and two data outputs 60c and 60d, for outputting dt and dt'. The details of pipeline register 26 are described immediately below, first by addressing the data path for dtpip and then addressing the data path for dtpip'.

Input 60a is connected to the gate of a p-channel transistor 62. The source of transistor 62 is connected to $V_{cc}$ and its drain is connected to the input of an inverting latch 64. Inverting latch 64 consists of two inverters 64a and 64b connected in a known latching fashion. The output of latch 64 is connected to the data input of a passgate 66. Passgate 66 is controlled by complementary clock signals, with iclk2' at its inverting control input and iclk2 at its non-inverting control input. Note that iclk2 and iclk2' are clock signals internal to memory 10 and are generated as known in the art. The data output of passgate 66 is connected to the drain of an n-channel transistor 68 as well as to the input of an inverting latch 70. The source of transistor 68 is connected to ground. Inverting latch 70 consists of two inverters 70a and 70b connected in a known latching fashion. The output of latch 70 is connected to the data input of a passgate 72. Passgate 72 is controlled by complementary clock signals, with iclk3' at its inverting control input and iclk3 at its noninverting control input. Note that iclk3 and iclk3' also are clock signals internal to memory 10 and are generated as known in the art. The output of passgate 72 is connected to output 60d and, thus, provides the complementary output signal, dt.

The data path from input 60b to output 60c is symmetric to that from input 60c to output 60d described above. Thus, input 60b is connected to the gate of a p-channel transistor 74. The source of transistor 74 is connected to $V_{cc}$ and its drain is connected to the input of an inverting latch 76. Inverting latch 76 consists of two inverters 76a and 76b connected in a known latching fashion. The output of latch 76 is connected to the data input of a passgate 78. Passgate 78 is controlled by complementary clock signals, with iclk2' at its inverting control input and iclk2 at its non-inverting control input. The data output of passgate 78 is connected to the drain of an n-channel transistor 80 as well as to the input of an inverting latch 82. The source of transistor 80 is connected to ground. Inverting latch 82 consists of two inverters 82a and 82b connected in a known latching fashion. The output of latch 82 is connected to the data input of a passgate 84. Passgate 84 is controlled by complementary clock signals, with iclk3' at its inverting control input and iclk3 at its non-inverting control input. The output of passgate 84 is connected to output 60c and, thus, provides the output signal, dt.

In addition to the above data paths, a few additional cross-connections shown in FIG. 4 are as follows. Input 60a is also connected to the input of inverting latch 76, while input 60b is also connected to the input of inverting latch 64. Further, the gate of transistor 68 is connected to the output of passgate 78 while the gate of transistor 80 is connected to the output of passgate 66.

Having described the various connections of FIG. 4, the data flow from input 60a to output 60d is as follows. As a first example, assume dtpip is low. This low signal causes transistor 62 to conduct, thereby connecting a logical high (i.e., from $V_{cc}$) to the input of inverting latch 64 which then outputs a low to passgate 66. Upon receiving complementary clock signals from iclk2 and iclk2', passgate 66 connects the low from inverting latch 64 to the input of inverting latch 70. Upon receiving complementary clock signals from iclk3 and iclk3', passgate 72 connects the high from inverting latch 70 to output 60d. Thus, one skilled in the art will appreciate that data flow from input 60a to output 60d includes two latching stages, and causes the data at output 60d to be the complement of the data at input 60a (after passing along the data path).

In addition to the data at output 60d caused by the data at input 60a, note one aspect of the cross-connect when the data at input 60a is low. Specifically, this low signal is connected to inverter 76 which, therefore, outputs a high. Thus, because the connections in the path from input 60b to output 60c are the same as those between input 60a and output 60d, the data at output 60c will be the complement of the data at output 60d.

Having described the example where dtpip is low, the following describes the data flow from input 60a to output 60d when dtpip is high. Initially, the high is connected to the gate of transistor 62 but, because that transistor is pchannel, it will not conduct. Further, note that the drain of transistor 62 is also cross-connected to input 60b. Thus, because the input 60b is complementary to input 60a, and therefore because dtpip' is low in this example, then this low is connected to the drain of transistor 62 as well as to the input of inverting latch 64. Consequently, inverting latch 64 outputs a high which passes through passgate 66 to inverting latch 70 on the next assertion of iclk2 (and iclk2'). Note further that the high output passed by passgate 66 is cross-connected to the gate of transistor 80. Consequently, transistor 80 pulls down the input of inverting latch 82 and, thus, the input (and outputs) of latches 70 and 82 are complementary.

Having explained the data flow and cross-connects for a low and high input to input 60a, it is unnecessary to detail the same between data input 60b and output 60c. One skilled in the art will readily appreciate the symmetric connections of that path to the path already described and, thus, such a person is referred to the above explanation for an understanding of the corresponding data flow.

Figure 5:
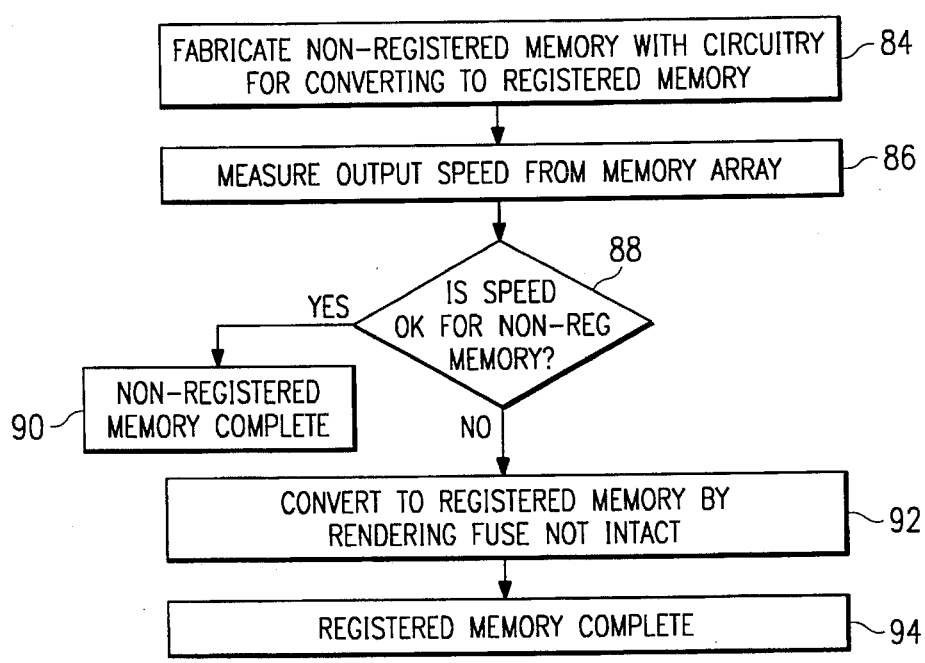
FIG. 5 illustrates a flow chart of the preferred method for converting a non-registered memory to a registered memory in accordance with the present invention.

FIG. 5 illustrates, with reference back to the blocks of FIG. 2, a method of fabrication and subsequent implementation of the present invention. Particularly, in step 84, memory 10 is fabricated to include an intact fuse, as well as the other circuitries shown in FIGS. 1–4. Typically, this fabrication step includes process steps known in the semiconductor manufacturing art. Note that "fabrication" is used herein to indicate the steps necessary in the semiconductor art whereby a semiconductor die is constructed, typically by constructing numerous die on a semiconductor wafer. Thus, with no further action, memory 10 is configured as a non-registered memory. In step 86, the data output speed of array 16 is measured (using known test procedures). Step 88 determines whether this data output speed is greater than a particular threshold speed, such as that defined by the anticipated specifications for a nonregistered memory chip. If so, the method continues to step 90, where no subsequent fabrication action is taken and memory 10 remains as a non-registered memory. Thus, the die may be stored, or may be immediately packaged, using known packaging techniques, as a non-registered memory. However, returning to step 88, if the data output speed is unsatisfactory, or if there exists some other reasons for converting the memory to a registered memory (e.g., market demand), the method continues to step 92 where fuse 30 is rendered not intact. Thus, step 94 following step 92 indicates that with fuse 30 not intact, memory 10 is converted to operate as a registered memory, that is, the circuitry passes data from array 16, to pipeline register 26, and then to output driver 20. Further, as in step 90, step 94 represents that the semiconductor die is complete and, therefore, may be stored, or may be immediately packaged as a registered memory.

Note that the method of FIG. 5 creates an efficient and improved method for constructing registered and non-registered memories. Particularly, as stated in the Background of the Invention, the prior art methodology often requires slow non-registered memories to be discarded because their speeds are tested once the memory fabrication is complete and cannot be converted to a non-registered memory. However, the present invention recognizes that the immediate output data path from array 16 for a registered memory is shorter than for a non-registered memory. This is because the path for a single access from a registered memory is only out of pipeline register 26 (because the data has previously been fetched from array 16 into pipeline register 26) while, in contrast, the same access from a non-registered memory requires delay in accessing the actual memory array (rather than just the pipeline register). Thus, if access time from array 16 is poor, fuse 30 is disabled, thereby converting memory 10 from a non-registered memory to a registered memory and allowing the part to be used rather than discarded as in the prior art.

From the above, it may be appreciated that the embodiments of the present invention provide a method and apparatus involving a memory which may be converted between a non-registered memory and a registered memory after the memory is fabricated. Further, the invention reduces costs, improves yields, and provides a conversion to meet market demand. Still further, while the preferred embodiment implements its conversion by disabling a fuse included within the memory, various alternatives may be known, or created without undue experimentation, by a person skilled in the art. Additional other changes or additions also may be implemented with departing from the spirit of the invention. For example, in addition to the use of power on reset as shown in FIG. 2, such a control signal may be used with the additional circuitries of memory 10 to ensure a known state when power is initially applied to the memory. As another example, various redundancy circuits may be employed to duplicate the disclosed circuitry for purposes known in the art. As still another example, while the preferred default operation of memory 10 is as a non-registered memory, the default instead could be as a registered memory, thereby using the fuse or other selectable option to convert the memory from a registered memory to a non-registered memory. Consequently, while the present invention has been described in detail, various substitutions, modifications or alterations could be made to the descriptions set forth above without departing from the invention which is defined by the following claims.

What is claimed is:

1. A memory comprising:
   a memory array having a data quantity output for outputting a data quantity;
   a data output driver having an input for receiving the data quantity and an output for outputting the data quantity from the memory;
   a data quantity pipeline register having an input for receiving the data quantity and an output coupled to said input of said data output driver; and
   means for selectively coupling a data quantity from said data quantity output of said memory array to said input of said data output driver in a first operational mode and from said data output of said memory array to said input of said data quantity pipeline register in a second operational mode.

2. The memory of claim 1 wherein said means for selectively coupling comprises a demultiplexer circuit having an input coupled to said data quantity output, a first output coupled to said input of said data output driver, and a second output coupled to said input of said data quantity pipeline register, wherein:
   in said first operational mode said demultiplexer circuit is operable to couple said data quantity output of said memory array to said data quantity input of said data output driver; and
   in said second operational mode said demultiplexer circuit is operable to couple said data quantity output of said memory array to said data quantity input of said data quantity pipeline register.

3. The memory of claim 2 and further comprising a control circuit operable to control said means for selectively coupling.

4. The memory of claim 3 wherein said control circuit comprises:
   a control output for outputting a control signal to said means for selectively coupling; and
   a fuse coupled to said control output, wherein said control signal is in a first state when said fuse is intact and wherein said control signal is in a second state when said fuse is not intact.

5. The memory of claim 4 wherein said fuse comprises a polysilicon fuse.

6. The memory of claim 3 wherein said memory is disposed within a package having a cavity for connecting to a predetermined voltage, and wherein said control circuit comprises a bond wire coupled between said cavity and a control output such that said control signal is fixed in either a first or second state when said bond wire is coupled between said cavity and a control output.

7. The memory of claim 1 and further comprising addressing circuitry having an input for receiving an address, and further comprising circuitry for generating a burst sequence of addresses.

8. The memory of claim 1 wherein said data quantity pipeline register comprises a two-stage data quantity pipeline register, and wherein each of said two stages comprises:
   an inverting latch having an input for receiving a data quantity and an output for outputting a complement of said input data quantity; and
   a passgate having an input coupled to said output of said inverting latch and an output for outputting said complement of said input data quantity.

9. The memory of claim 1 wherein said data quantity comprises a first data bit and a second data bit, wherein said second data bit is a logical high when said first data bit is a logical low.

10. A method of constructing a memory having an access speed, comprising the steps of:
    fabricating the memory as a non-registered memory;
    testing the access speed of the memory; and
    after said fabricating step, converting the memory to a registered memory if the access speed is below a threshold value.

11. The method of claim 10 wherein said fabricating step comprises:
    forming a memory array having a data quantity output for outputting a data quantity;
    forming a data output driver having an input for receiving the data quantity and an output for outputting the data quantity from the memory;

forming a data quantity pipeline register having an input for receiving the data quantity and an output coupled to the input of the data output driver; and forming a demultiplexer circuit having an input coupled to the data quantity output, a first output coupled to the input of the data output driver, and a second output coupled to the input of the data quantity pipeline register, wherein:

in a first operational mode the demultiplexer circuit is operable to couple the data quantity output of the memory array to the data quantity input of the data output driver; and in a second operational mode the demultiplexer circuit is operable to couple the data quantity output of the memory array to the data quantity input the data quantity pipeline register.

12. The method of claim 11 wherein said fabricating step further comprises the step of forming a control circuit operable to control the demultiplexer circuit.

13. The method of claim 12 wherein said step of forming a control circuit comprises:

forming an output from the control circuit to output a demultiplexer control signal to the demultiplexer circuit; and forming a fuse, wherein the demultiplexer control signal controls the demultiplexer to operate in the first operational mode if the fuse is intact and wherein the demultiplexer control signal controls the demultiplexer to operate in the second operational mode if the fuse is not intact.

14. The method of claim 13 wherein said step of forming a fuse comprises forming a polysilicon fuse.

15. The method of claim 13 wherein said step of converting the memory to a registered memory comprises rendering the fuse not intact.

16. The method of claim 15 said step of rendering the fuse not intact comprises subjecting the fuse to a beam of energy from a laser.

17. The method of claim 12 wherein said step of forming a control circuit comprises:

forming an output from the control circuit to output a demultiplexer control signal to the demultiplexer circuit; and forming a bond wire, wherein the demultiplexer control signal controls the demultiplexer to operate in the first operational mode if the bond wire is formed and wherein the demultiplexer control signal controls the demultiplexer to operate in the second operational mode if the bond wire is not formed.

18. The method of claim 10 wherein said fabricating step comprises fabricating the memory using semiconductor fabrication steps.

19. A method of constructing a memory, comprising the steps of:

fabricating the memory as a non-registered memory, wherein said fabricating step comprises:

fabricating a memory array;

fabricating a conductive path connected to the memory array for outputting data from the memory array to an output pin;

fabricating a data pipeline register initially removed from the conductive path; and after said step of fabricating the memory as a nonregistered memory, converting the memory to a registered memory such that data passes from the memory array through the data pipeline register and to the output pin.

20. The method of claim 19 wherein said step of fabricating the memory as a non-registered memory further comprises:

fabricating an alternative path from the memory array to the data pipeline register; and fabricating a fuse wherein data bypasses the pipeline register and is coupled from the memory array to the output pin if the fuse is intact, and wherein data passes from the memory array to the data pipeline register to the output pin if the fuse is not intact.

21. The method of claim 20 wherein said step of converting the memory to a registered memory comprises rendering the fuse not intact.

22. The method of claim 19 and further comprising the step of packaging the memory in an integrated circuit package.

23. A method of constructing a memory, comprising the steps of:

fabricating a memory array;

fabricating a first conductive path for outputting data from the memory array to an output pin;

fabricating a data pipeline register;

fabricating a second conductive path for outputting data from the memory array through the data pipeline register to the output pin; and fabricating means for selectively coupling the data along the first conductive path in a first operational mode and for selectively coupling the data along the second data path in a second operational mode.

24. The method of claim 23 and further comprising fabricating a connecting element wherein said means for selectively coupling causes the memory to operate in the first operational mode if the connecting element is intact.

25. The method of claim 24 wherein said means for selectively coupling causes the memory to operate in the second operational mode if the connecting element is not intact.

26. The method of claim 23 and further comprising fabricating a connecting element wherein said means for selectively coupling causes the memory to operate in the second operational mode if the connecting element is intact.

* * * * *